United States Patent
Sakuma et al.

(10) Patent No.: US 6,537,422 B2
(45) Date of Patent: Mar. 25, 2003

(54) SINGLE-SUBSTRATE-HEAT-PROCESSING APPARATUS FOR SEMICONDUCTOR PROCESS

(75) Inventors: Takeshi Sakuma, Tsukui-gun (JP); Kenji Homma, Tsukui-gun (JP); Takahiro Horiguchi, Tsukui-gun (JP)

(73) Assignee: Tokyo Electron Limited, Tokyo (JP)

( * ) Notice: Subject to any disclaimer, the term of this patent is extended or adjusted under 35 U.S.C. 154(b) by 79 days.

(21) Appl. No.: 09/839,292

(22) Filed: Apr. 23, 2001

(65) Prior Publication Data

US 2001/0035131 A1 Nov. 1, 2001

(30) Foreign Application Priority Data

Apr. 26, 2000 (JP) ........................................ 2000-126538

(51) Int. Cl.$^7$ ............................................. H01L 21/306
(52) U.S. Cl. .............................. 156/345.5; 156/345.54; 118/724
(58) Field of Search .................. 118/725, 724, 118/728, 719, 729, 50.1, 715, 52, 319, 320, 500, 56, 620, 723 E; 392/416, 418; 219/405, 390, 411; 156/345.37, 345.38, 345.5, 345.54; 216/75; 204/298.25, 298.15, 192.1, 298.27

(56) References Cited

U.S. PATENT DOCUMENTS

| 5,991,508 A | * | 11/1999 | Ohmine et al. ............. 118/724 |
| 6,002,109 A | * | 12/1999 | Johnsgard et al. ......... 118/50.1 |
| 6,072,163 A | * | 6/2000 | Armstrong et al. ......... 118/724 |
| 6,200,634 B1 | * | 3/2001 | Johnsgard et al. .......... 118/666 |
| 6,232,248 B1 | * | 5/2001 | Shinriki et al. ............. 438/680 |
| 6,301,434 B1 | * | 10/2001 | McDiarmid et al. ........ 118/724 |

* cited by examiner

Primary Examiner—Jeffrie R. Lund
Assistant Examiner—Rudy Zervigon
(74) Attorney, Agent, or Firm—Oblon, Spivak, McClelland, Maier & Neustadt, P.C.

(57) ABSTRACT

A higher-temperature heating zone and lower-temperature heating zone are set in a process chamber for a single-substrate-heat-processing apparatus in order to subject a wafer to two processes with different process temperatures. In the higher-temperature heating zone, the wafer is heated as it is placed on a worktable. In the lower-temperature heating zone, the wafer is heated with a smaller heat quantity as it floats above the worktable. In the lower-temperature heating zone, a heat ray reflector for compensating for heat dissipated from the peripheral portion of the wafer is disposed to surround the wafer.

16 Claims, 11 Drawing Sheets

SINGLE-SUBSTRATE-HEAT-PROCESSING APPARATUS FOR SEMICONDUCTOR PROCESS

CROSS-REFERENCE TO RELATED APPLICATIONS

This application is based upon and claims the benefit of priority from the prior Japanese Patent Application No. 2000-126538, filed Apr. 26, 2000, the entire contents of which are incorporated herein by reference.

BACKGROUND OF THE INVENTION

The present invention relates to a single-substrate-heat-processing apparatus for a semiconductor process, which performs processes such as annealing, film formation, etching, oxidation, and diffusion. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or an LCD substrate, by forming semiconductor layers, insulating layers, and conductive layers in predetermined patterns on the target substrate.

In the process of manufacturing semiconductor devices, several types of heat-processing apparatuses are used for subjecting target substrates, such as semiconductor wafers, to a semiconductor process, such as annealing, film formation, etching, oxidation, and diffusion. A single-substrate-heat-processing apparatus, which handles wafers one by one, is known as one of these heat-processing apparatuses. The single-substrate-heat-processing apparatus allows a heat process to be relatively easily performed with a high planer uniformity on a wafer, even when the heat process requires the process temperature to be raised and lowered quickly. For this reason, the single-substrate-heat-processing apparatus has become popular, as the size of wafers has been larger, and the size of semiconductor devices has been smaller.

The process conditions, e.g., a process gas, a process temperature, and a process pressure, employed in the single-substrate-heat-processing apparatus largely change depending on the processing steps. For example, when a tantalum oxide film ($Ta_2O_5$), which recently attracts attention as a film with good insulating characteristics, is to be formed, heat-processing is performed in deposition, reformation, and crystallization of the film, and different process conditions are respectively employed in these processing steps.

In the manufacture of semiconductor devices, an increase in throughput is an important object in order to increase the mass productivity. As the cost necessary for maintaining the heat-processing apparatus is very high, it is required to reduce the number of units to be installed as small as possible. Under these circumstances, it has been proposed to perform similar processing steps, e.g., reformation and crystallization described above, continuously in a single heat-processing apparatus. Sometimes, however, the two processing steps have largely different process temperatures, like the processing steps of reformation and crystallization do. In this case, it takes time to change, particularly to increase, the temperature of the wafer. This decreases the throughput.

As a single-substrate-heat-processing apparatus, one with a structure that uses a heating lamp disposed under the worktable as a wafer heating source is known. This structure is advantageous in that it can increase the wafer temperature increase speed, while it is disadvantageous in that the window for transmitting light from the lamp therethrough is fogged from inside to likely decrease the heat efficiency and planar uniformity of heating. Therefore, depending on the contents of the process, an apparatus of this type is not appropriate as a mass-production apparatus.

In the most general single-substrate-heat-processing apparatus, a resistance heater disposed in the worktable is used as a wafer heating source. This structure is advantageous in that it can perform stable heating, while it is disadvantageous in that the wafer temperature increase rate decreases. In other words, it takes a comparatively long period of time since the amount of power to be supplied to the resistance heater is increased until the worktable and wafer reach a desired temperature.

BRIEF SUMMARY OF THE INVENTION

It is an object of the present invention to provide a single-substrate-heat-processing apparatus for a semiconductor process, which can perform a plurality of, e.g., two, processes with different process temperatures continuously and quickly.

According to a first aspect of the present invention, there is provided a single-substrate-heat-processing apparatus for a semiconductor process, comprising:

an airtight process chamber;

a worktable configured to place a target substrate thereon and to heat the target substrate in the process chamber;

a first heater configured to heat the worktable;

a gas supply system configured to supply a process gas into the process chamber;

an exhaust system configured to evacuate an interior of the process chamber;

a moving mechanism configured to move the target substrate between a first position on the worktable and a second position above the worktable, the first and second positions being set to subject the target substrate to first and second processes, the first process having a process temperature higher than that of the second process; and a heat compensation member configured to surround the target substrate so as to compensate for heat dissipated from a peripheral portion of the target substrate when the target substrate is located at the second position, the heat compensation member being disposed in the process chamber and separated from an inner surface of the process chamber through a gap.

According to a second aspect of the present invention, there is provided a single-substrate-heat-processing apparatus for a semiconductor process, comprising:

an airtight process chamber;

a worktable configured to place a target substrate thereon in the process chamber;

a first heater configured to heat the worktable;

a gas supply system configured to supply a process gas into the process chamber;

an exhaust system configured to evacuate an interior of the process chamber;

a first heating zone set in the process chamber in order to subject the target substrate to a first process at a first process temperature, the target substrate being heated, while being placed on the worktable, in the first heating zone by the first heater as a heat source;

a second heating zone set in the process chamber in order to subject the target substrate to a second process at a second process temperature, the target substrate being heated, while being placed above the worktable, in the second heating zone by the first heater as a heat source, the second process temperature being lower than the first process temperature;

a heat compensation member configured to surround the target substrate to compensate for heat dissipated from a peripheral portion of the target substrate in the second heating zone, the heat compensation member being disposed in the process chamber and separated from an inner surface of the process chamber through a gap; and a moving mechanism configured to move the target substrate between the first and second heating zones.

According to a third aspect of the present invention, there is provided a processing method in a single-substrate-heat-processing apparatus for a semiconductor process, comprising the steps of:

arranging a target substrate at a first position on a worktable disposed in an airtight process chamber and subjecting the target substrate to a first process at a first temperature;

arranging the target substrate at a second position above the worktable before or after the first process and subjecting the target substrate to a second process at a second temperature, the second process temperature being lower than the first process temperature; and surrounding the target substrate with a heat compensation member during the second process to compensate for heat dissipated from a peripheral portion of the target substrate, the heat compensation member being disposed in the process chamber and separated from an inner surface of the process chamber through a gap.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The preferred embodiments of the present invention will be described with reference to the accompanying drawing. In the following description, the constituent elements having substantially the same functions and arrangements are denoted by the same reference numerals, and a repetitive explanation will be made only when it is necessary.

Figure 1:
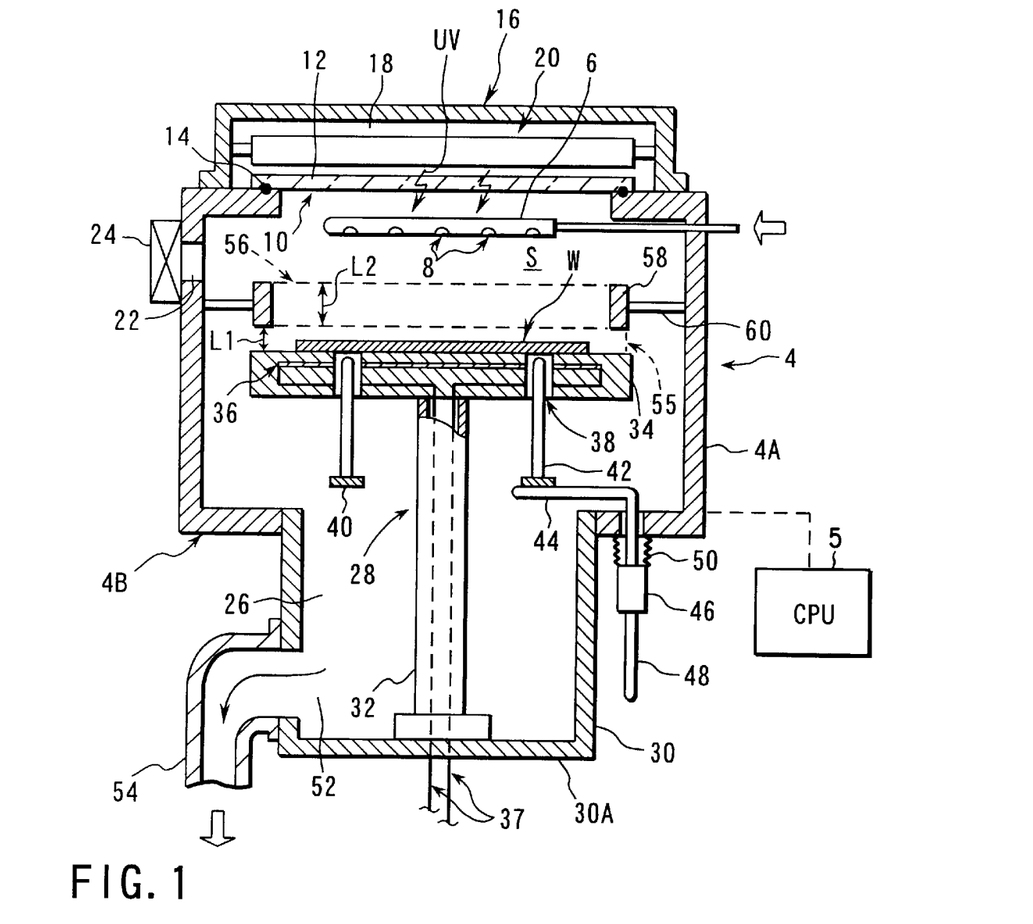
FIG. 1 is a sectional view showing a single-substrate-heat-processing apparatus with a heat ray reflector according to an embodiment of the present invention.

FIG. 1 is a sectional view showing a single-substrate-heat-processing apparatus with a heat ray reflector according to an embodiment of the present invention. This heat-processing apparatus 2 reforms a metal oxide film such as a tantalum oxide film ($Ta_2O_5$) in a lower-temperature heating zone and consecutively crystallizes it in a higher-temperature heating zone. The operation of the heat-processing apparatus 2 is controlled by a CPU 5.

As shown in FIG. 1, for example, the heat-processing apparatus 2 has a process chamber 4 made of aluminum and with a substantially circular section. A ring-like showerhead 6 made of quartz is disposed on the ceiling in the process chamber 4 in order to introduce a necessary process gas. A large number of gas spouting holes 8 are formed in the lower surface of the showerhead 6 so the process gas is spouted toward a process space S.

The ceiling of the process chamber 4 has a large opening 10. For example, a transmission window 12 made of a quartz plate transparent to ultraviolet rays is airtightly attached to the opening 10 through a seal member 14 such as an O-ring. A lamp chamber 18 covered with a casing 16 is disposed above the transmission window 12. A plurality of ultraviolet lamps 20 are disposed in the lamp chamber 18. Ultraviolet rays UV emitted from the ultraviolet lamps 20 are introduced into the process space S through the transmission window 12.

A port 22, through which a semiconductor wafer W as a target substrate is to be loaded in/unloaded from the process chamber 4, is formed in a sidewall 4A of the process chamber 4. An airtightly openable gate valve 24 is disposed at the port 22. The process chamber 4 is temperature-controlled by a temperature control medium (not shown).

A gas trap space 26 is formed in a bottom portion 4B of the process chamber 4. More specifically, the bottom portion 4B has a large opening 28 at its central portion. A bottomed cylindrical wall 30 is connected to the opening 28 to extend downward, and the space 26 is formed in the cylindrical wall 30. For example, a cylindrical column 32 stands upright from a bottom 30A of the cylindrical wall 30 that defines the space 26.

A disk-like worktable 34 is fixed to the upper end of the cylindrical column 32, and the wafer W is placed on the upper surface of the worktable 34. The outer surface of the worktable 34 is made of a sintered ceramic material consisting of, e.g., AlN. As a heating means, a resistance heater 36 is arranged in the worktable 34 to have a predetermined pattern. The resistance heater 36 is connected to a feeder 37 disposed in the cylindrical column 32, so a level-controlled power is supplied to the resistance heater 36.

The worktable 34 has a plurality of holes 38 vertically extending through it. The holes 38 respective loosely receive lifter pins 42 made of, e.g., quartz, and commonly connected to a connection ring 40 at their lower ends. The lifter pins 42 serve as an assist mechanism which assists loading/unloading of the wafer W on/from the worktable 34 by an external transfer arm. The lifter pins 42 also serve as a moving mechanism which moves the wafer W between the higher-temperature zone on the worktable 34 and the lower-temperature zone above the worktable 34.

The connection ring 40 for supporting the lifter pins 42 is vertically driven by a lever 44. The lever 44 is connected to a piston rod 48 of an air cylinder 46 provided to the lower surface of the bottom portion 4B. The lifter pins 42 project upward from the upper ends of the corresponding holes 38 when transferring the wafer W. A bellows 50 is interposed between the air cylinder 46 and the lower surface of the bottom portion 4B. The piston rod 48 is vertically moved while the airtightness in the process chamber 4 is maintained by the bellows 50.

The diameter of the opening at the inlet of the gas trap space 26 is smaller than that of the worktable 34. Hence, the process gas flowing downward outside the periphery of the worktable 34 goes under the worktable 34 to flow into the space 26. An exhaust port 52 is formed in the lower portion of the cylindrical wall 30. The exhaust port 52 is connected to a vacuum pump (not shown) through an exhaust pipe 54 in order to evacuate the atmospheres in the process chamber 4 and space 26.

The higher-temperature heating zone 55 and lower-temperature heating zone 56 are set in the process chamber 4 in order to subject the wafer W to two processes with different process temperatures, respectively. In the higher-temperature heating zone 55, the wafer W is heated while it is placed on the worktable 34. In the lower-temperature heating zone 56, the wafer W floats above the worktable 34, and is heated with a smaller heat quantity than that in a case wherein the wafer W is directly placed on the worktable 34. In FIG. 1, the higher- and lower-temperature heating zones 55 and 56 are surrounded by broken lines.

The lower-temperature heating zone 56 is arranged between the worktable 34 and a transfer space above it where the wafer W is transferred between the external transfer arm and the lifter pins 42. The port 22 with the gate valve 24 is formed beside the transfer space. A distance L1 between the worktable 34 and lower-temperature heating zone 56 is set to about several mm to several 10 mm, and for example in a range of 10 to 30 mm. The lifter pins 42 can move the wafer W among the first position on the worktable 34 and corresponding to the higher-temperature heating zone 55, the second position above the worktable 34 and corresponding to the lower-temperature heating zone 56, and the third position for transfer above the second position.

Figure 2:
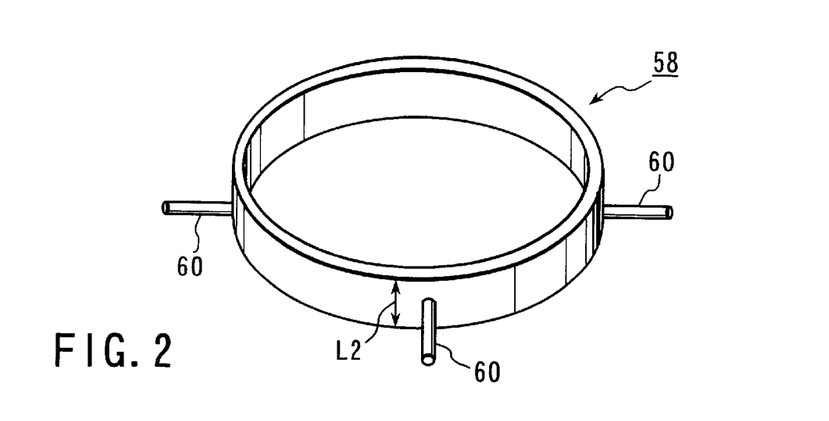
FIG. 2 is a perspective view showing the heat ray reflector of the apparatus shown in FIG. 1.
Figure 4:
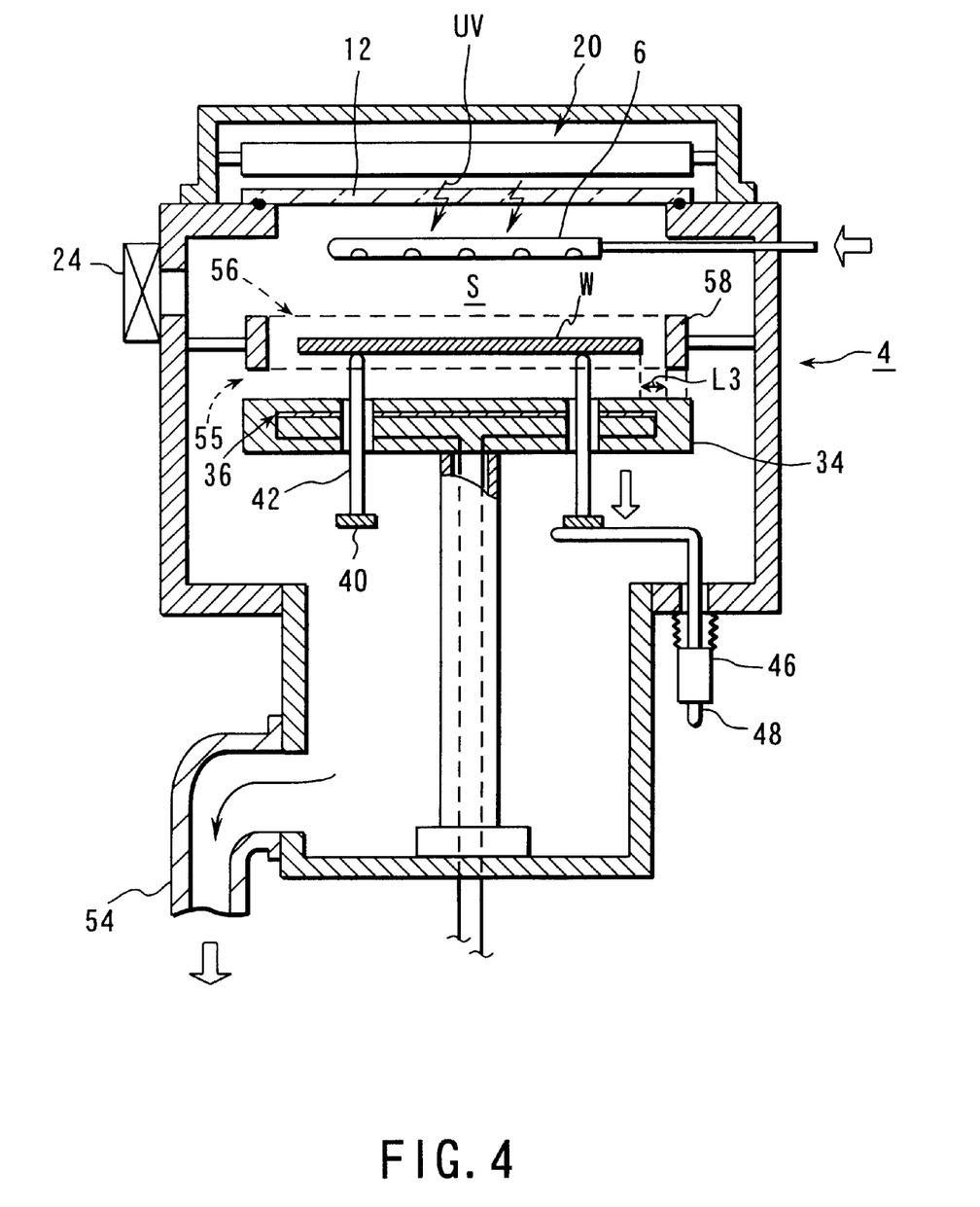
FIG. 4 is a sectional view of the apparatus shown in FIG. 1 in a state wherein the target substrate is to be heated in a lower-temperature heating zone.

A circular ring-like heat ray reflector (heat compensation member) 58 with a height L2 is disposed to surround the lower-temperature heating zone 56. FIG. 2 is a perspective view showing the reflector 58 shown in FIG. 1. The reflector 58 has an inner diameter slightly larger than the diameter of the wafer W by, e.g., several mm to several 10 mm. As shown in FIG. 4, the wafer W is concentrically arranged in the reflector 58. At this time, a distance L3 between the periphery of the wafer W and the opposing surface of the reflector 58 is set to, e.g., about 1 to 20 mm, and preferably 5 to 10 mm. The height L2 of the reflector 58 is set within the range of, e.g., about several mm to several 10 mm.

The reflector 58 is supported by and fixed to the sidewall 4A of the process chamber 4 to be separated from the inner surface of the process chamber 4 through a gap. The reflector 58 is made of a material with a high heat-ray reflectivity, high corrosion resistance, and high heat resistance, e.g., a ceramic material such as AlN. The opposing surface of the reflector 58 forms a mirror surface with a surface roughness Rmax of 25 $\mu$m or less. The heat rays are reflected by the opposing surface toward the wafer W, thereby compensating for the temperature of the peripheral portion of the wafer where the heat dissipation quantity tends to increase. Since the reflector 58 itself is temperature-controlled as it is heated by the resistance heater 36, its temperature becomes higher than that of the inner wall of the process chamber 4, thereby preventing heat from escaping from the peripheral portion of the wafer W. For this purpose, it is desirable that the reflector 58 be substantially thermally independent of the inner wall of the process chamber 4.

A heat-processing method performed in the apparatus shown in FIG. 1 will be described. The following heat-processing method is performed under the control of the CPU 5 which controls the operation of the apparatus shown in FIG. 1. A case will be described wherein a tantalum oxide film exemplifying a metal oxide film formed on a semiconductor wafer is to be heat-processed. In this heat-processing method, a lower-temperature process, e.g., reformation (oxidation), which is performed at a relatively low process temperature of, e.g., 670° C., and a higher-temperature process, e.g., crystallization, which is performed at a relatively high process temperature of, e.g., 800° C., are performed continuously as will be described hereinafter.

As described above, in the pre-step, a tantalum oxide film is formed on the new wafer W to a predetermined thickness. Before the wafer W is loaded, the interior of the process chamber 4 is evacuated. The worktable 34 for placing the wafer W thereon is heated by the resistance heater 36 serving as a heating means to a temperature necessary for the higher-temperature heating zone 55, i.e., a crystallization temperature or a temperature near it. The interior of the lower-temperature heating zone 56 above the worktable 34 is set to a reformation temperature (670° C.), which is lower than the temperature of the higher-temperature heating zone 55, or a temperature near it.

Figure 3:
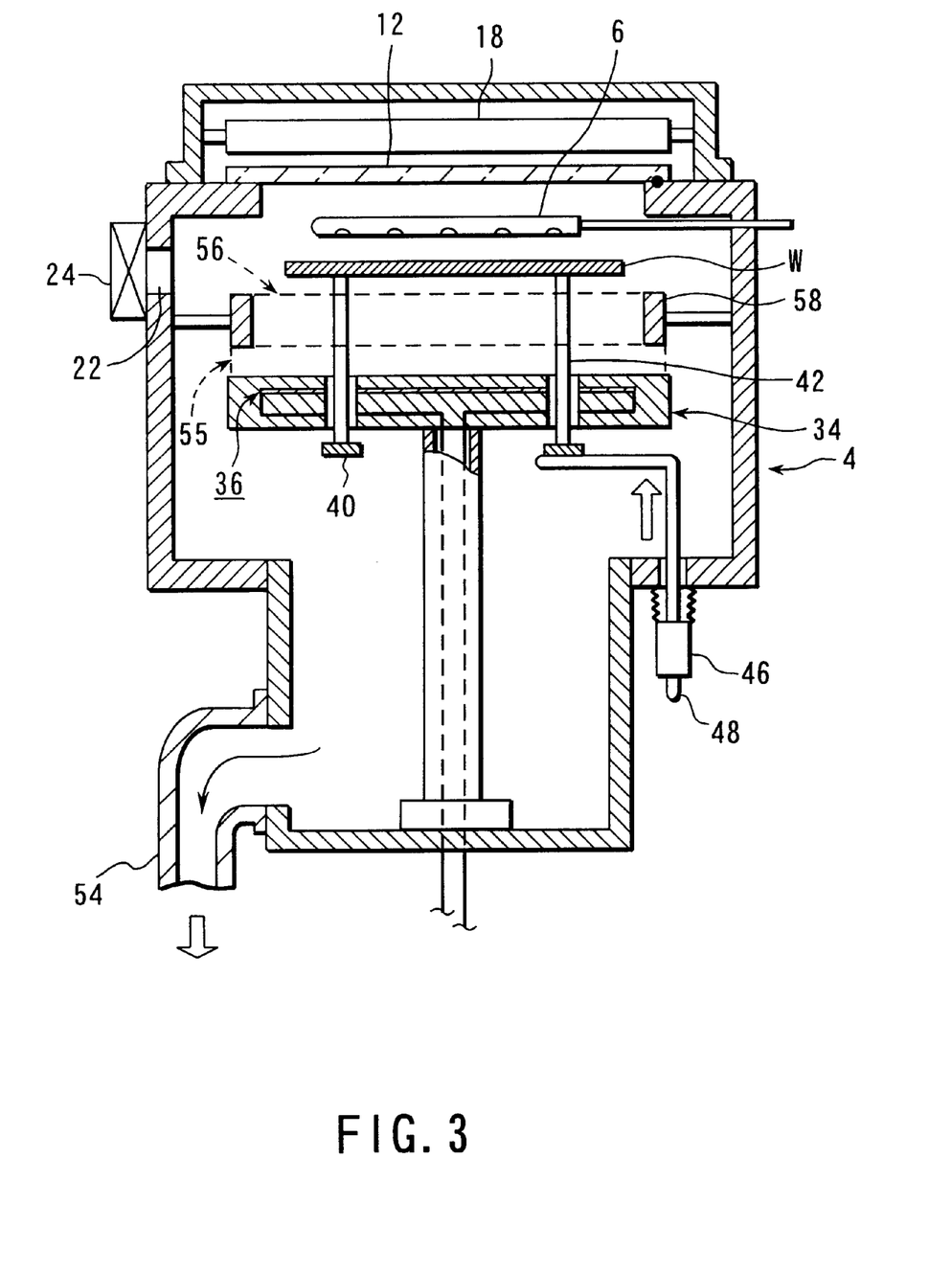
FIG. 3 is a sectional view of the apparatus shown in FIG. 1 in a state wherein a target substrate is to be loaded/unloaded.

In this state, the new wafer W is held by the external transfer arm (not shown) so it is transferred from the load-lock chamber (not shown) connected to the process chamber 4 and is loaded into the process chamber 4 through the opened gate valve 24 and port 22. The wafer W is transferred to the lifter pins 42 located at the uppermost position, as shown in FIG. 3. Subsequently, the lifter pins 42 move downward and stop as the wafer W is set in the lower-temperature heating zone 56, as shown in FIG. 4.

Since the lower-temperature heating zone 56 is heated in advance to a reformation temperature of, e.g., about 670° C., the wafer w is heated to and maintained at this reformation temperature. If the lower-temperature heating zone 56 is not sufficiently heated in advance, after the wafer W is positioned in the zone 56, a power to be supplied to the resistance heater 36 is increased so the wafer W is heated to the reformation temperature and maintained at this temperature.

The ultraviolet lamps 20 are driven. The ultraviolet rays UV generated by the ultraviolet lamps 20 are transmitted through the transmission window 12 in the ceiling to irradiate the surface of the wafer W. Simultaneously, for example, ozone is supplied by spouting as a process gas from the showerhead 6 into the process space S. The vacuum pump (not shown) connected to the exhaust pipe 54 is continuously driven to evacuate the atmospheres in the process chamber 4 and space 26, thereby maintaining the atmosphere in the process space S at the reformation process pressure. Hence, the tantalum oxide film on the surface of the wafer W is reformed (oxidized) by ozone activated by the ultraviolet rays UV, and is annealed.

Since the heat dissipation quantity from the peripheral portion of the wafer W is larger than that from the central portion of the wafer W, the temperature at the peripheral portion of the wafer W tends to become lower than that at the central portion of the wafer W. In this embodiment, however, the heat rays radiated from the peripheral portion of the wafer W and from the worktable 34 are reflected by the reflector 58 and are supplied to the peripheral portion of the wafer W again. As a result, heat dissipated from the peripheral portion of the wafer W is compensated for to suppress the temperature decrease, so reformation can be performed while maintaining the planar uniformity of the wafer temperature at a high level.

After the process is performed for a predetermined period of time to perform reformation, the lifter pins 42 move downward to place the wafer W on the worktable 34, as shown in FIG. 1, i.e., to arrange it in the higher-temperature heating zone 55. Since the worktable 34 is heated in advance as described above to the crystallization temperature of, e.g., 800° C., or a temperature near it, the wafer W is heated to the crystallization temperature quickly and easily, and is maintained at this temperature. In place of the ozone gas, a crystallization process gas, e.g., $N_2$ gas, which is inactive, is supplied from the showerhead 6, and a crystallization process is performed for a predetermined period of time.

In this manner, according to this embodiment, the wafer W is subjected to reformation while it floats above the worktable 34, and then to crystallization at a process temperature higher than that for reformation while it is in contact with the upper surface of the worktable 34. Therefore, unlike in the conventional method, the two heat processes need not be performed separately by different heat-processing apparatuses. The wafer W can be heated from the reformation temperature to crystallization temperature quickly. This increases the throughput. As a single heat-processing apparatus suffices, the facility cost can be reduced accordingly. The reflector (heat compensation member) 58 in the lower-temperature heating zone 56 can compensate for the temperature of the peripheral portion of the wafer where the heat dissipation quantity tends to increase. Therefore, during reformation, the planar uniformity of the wafer temperature can be maintained at a high level.

In this embodiment, after the wafer W is loaded in the process chamber 4, it is immediately arranged in the lower-temperature heating zone 56. Alternatively, the wafer W may be directly placed on the worktable 34 for such a short period of time that the wafer W will not reach the crystallization temperature, thereby quickening the temperature increase. In this case, when the wafer temperature almost reaches the reformation temperature, the wafer W is immediately moved to the lower-temperature heating zone 56, and is subjected to the reformation process for a predetermined period of time, as described above. With this method, the temperature increase time of the wafer W can be shortened, thereby further increasing the throughput.

Figure 5:
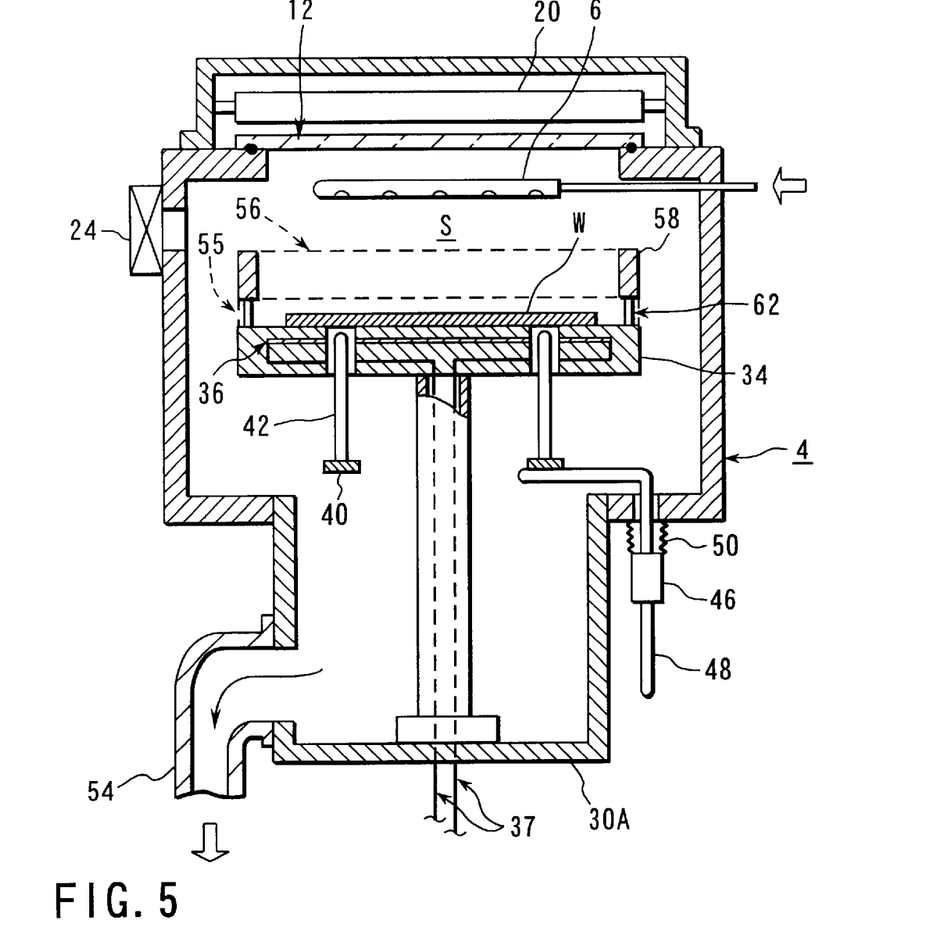
FIG. 5 is a sectional view showing a single-substrate-heat-processing apparatus according to another embodiment of the present invention, in which a heat ray reflector is supported on a worktable.
Figure 6:
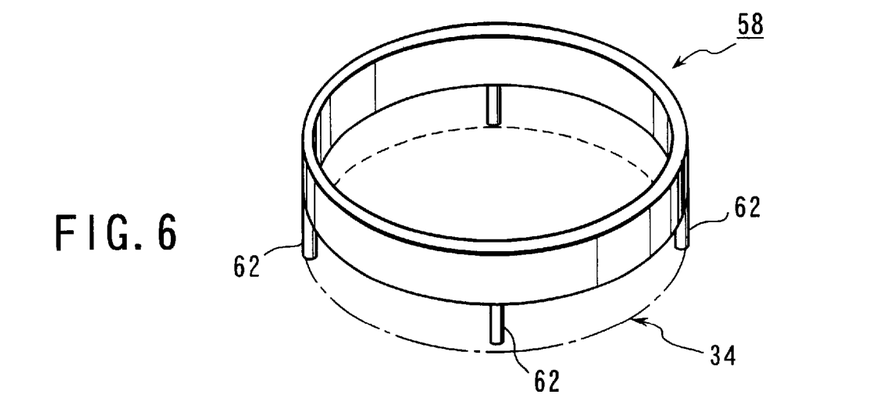
FIG. 6 is a perspective view of the heat ray reflector of the apparatus shown in FIG. 5.

FIG. 5 is a sectional view showing a single-substrate-heat-processing apparatus according to another embodiment of the present invention, in which a heat ray reflector is supported by a worktable, and FIG. 6 is a perspective view of this heat ray reflector. In this embodiment, a plurality of support rods 62 made of, e.g., quartz, are disposed to extend downward from the lower end of a heat ray reflector 58. The lower ends of the support rods 62 are fixed to the peripheral portion of a worktable 34, so the reflector 58 is supported by the worktable 34.

Figure 7:
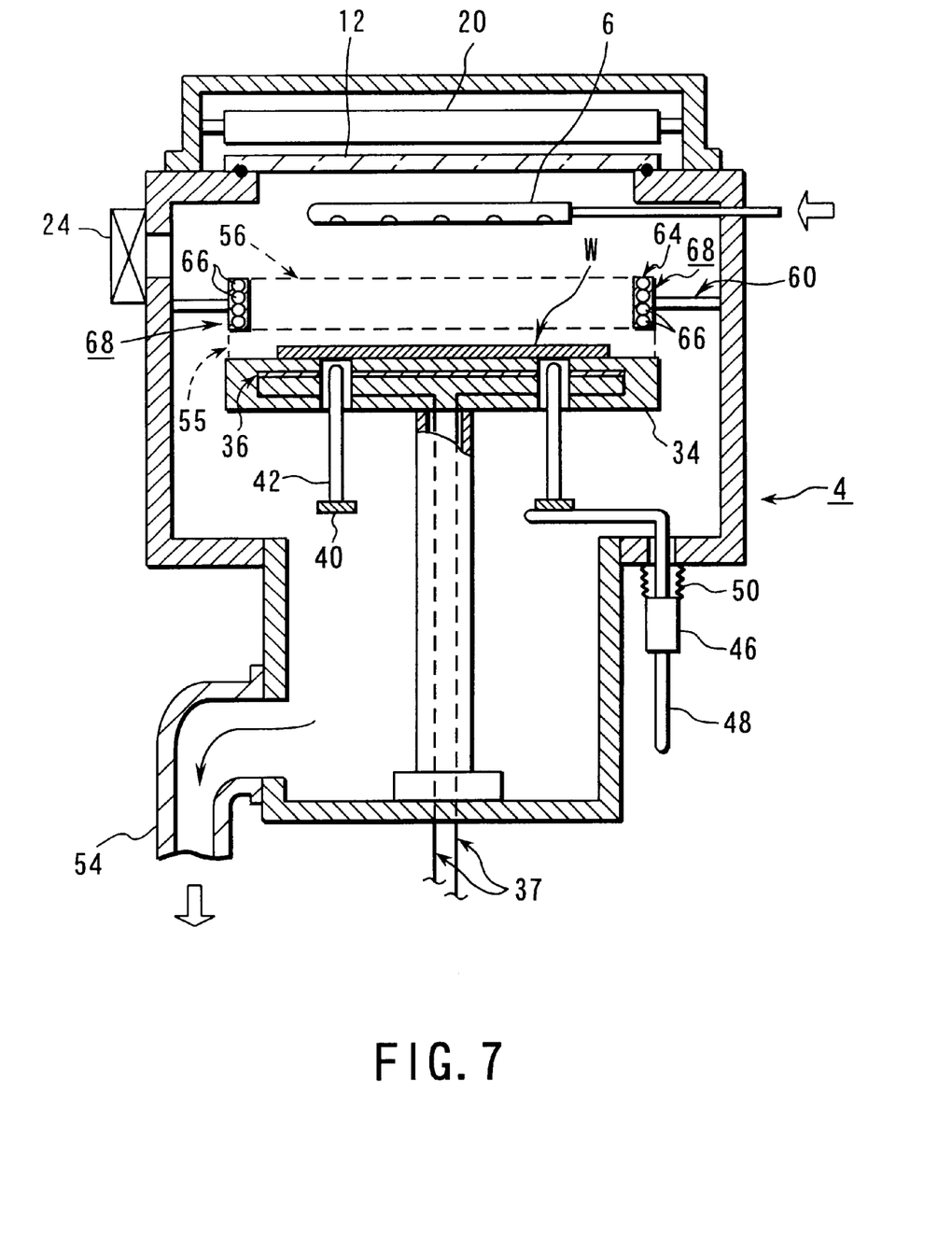
FIG. 7 is a sectional view showing a single-substrate-heat-processing apparatus with an auxiliary heater according to still another embodiment of the present invention.

FIG. 7 is a sectional view showing a single-substrate-heat-processing apparatus with an auxiliary heater according to still another embodiment of the present invention. In this embodiment, the heat compensation member has a ring-like auxiliary heater 68, i.e., a second heater, for heating the peripheral portion of a wafer W by self-heating. The auxiliary heater 68 is formed by inserting or burying a spiral resistance heating coil 66 in an insulating member 64 formed of, e.g., a quartz pipe. The auxiliary heater 68 is supported by and fixed to a sidewall 4A of a process chamber 4 with support arms 60. Alternatively, the auxiliary heater 68 may be supported by the worktable 34 through support rods 62 identical to those shown in FIG. 5. According to this embodiment, since the auxiliary heater 68 is temperature-controlled, the peripheral portion of the wafer is positively heated, so the planar uniformity of the wafer temperature during reformation can be further improved. The distance between the wafer W and auxiliary heater 68 is set to about 1 to 20 mm, preferably 5 to 10 mm.

The result of simulation performed regarding the operations of the reflector 58 and the auxiliary heater 68 will be described.

Figure 8:
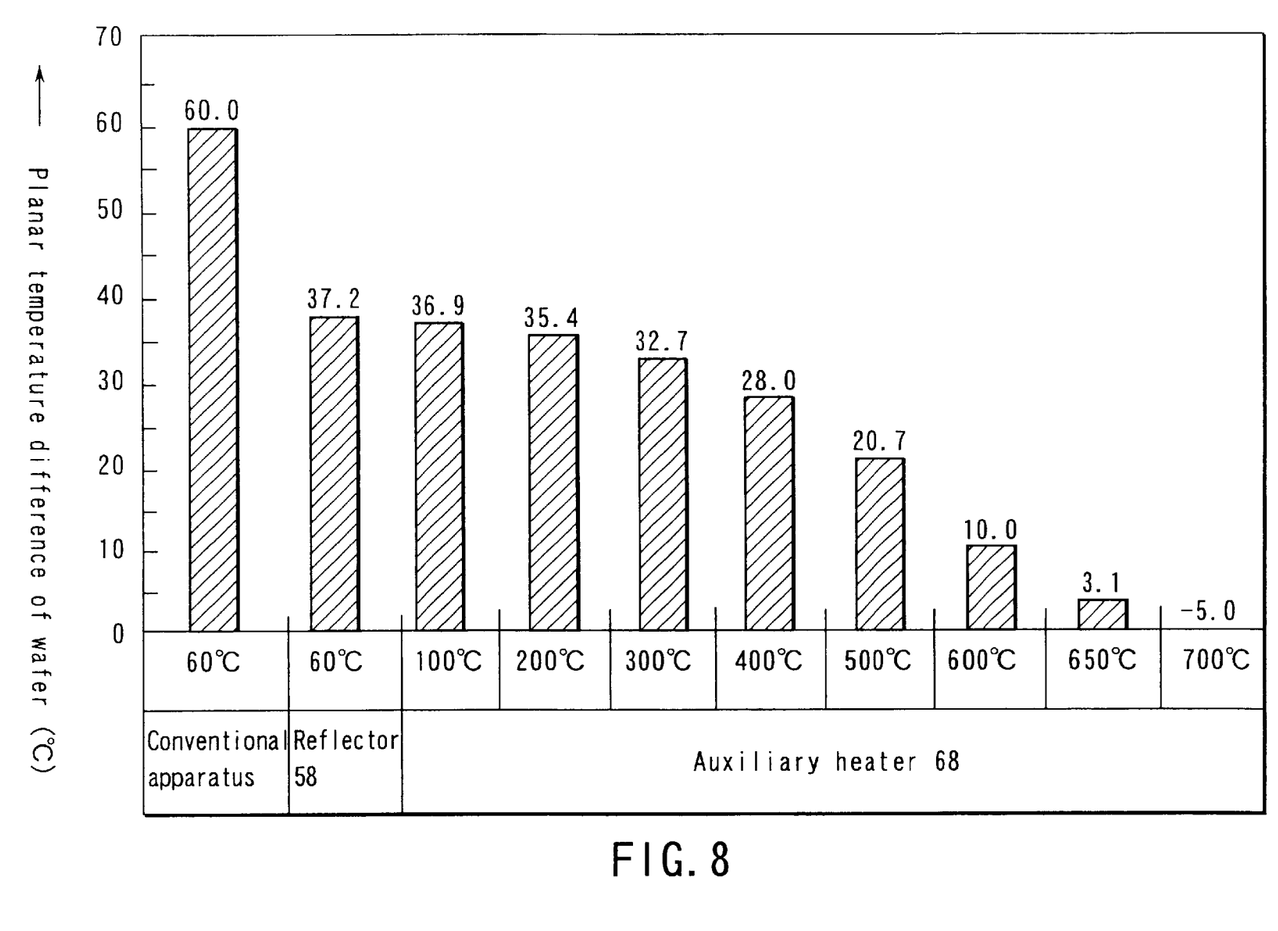
FIG. 8 is a graph showing the planar temperature distribution of a wafer, obtained with a conventional apparatus, an apparatus with the heat ray reflector according to the present invention, and an apparatus with the auxiliary heater according to the present invention.

FIG. 8 is a graph showing the planar temperature distribution of a wafer, obtained with a conventional apparatus, the apparatus with the heat ray reflector 58 according to the present invention, and the apparatus with the auxiliary heater 68 according to the present invention. In FIG. 8, the planar temperature difference of the wafer, which is plotted along the axis of ordinate, indicates the temperature difference between the central portion and peripheral portion of an 8-inch (200 mm) wafer, and the axis of abscissa indicates the temperatures of the sidewall of the process chamber, the heat ray reflector 58, and the auxiliary heater 68 (the preset temperature of which is changed), respectively. The central temperature of the wafer W is set to 670° C., and the temperature of the sidewall is set to 60° C.

As is apparent from the graph of FIG. 8, by only providing the reflector 58, the planar temperature difference of the wafer can be decreased from 60° C. to about 37.2° C. by about 23° C. Furthermore, when the auxiliary heater 68 is provided to increase the temperature of the wafer W, the planar temperature difference of the wafer can be further decreased. In particular, to decrease the planar temperature difference to 10° C. or less, the auxiliary heater 68 may be heated to 600° C. or more. In this manner, the effectiveness of the heat ray reflector 58 and auxiliary heater 68 can be verified by the graph of FIG. 8.

Figure 9:
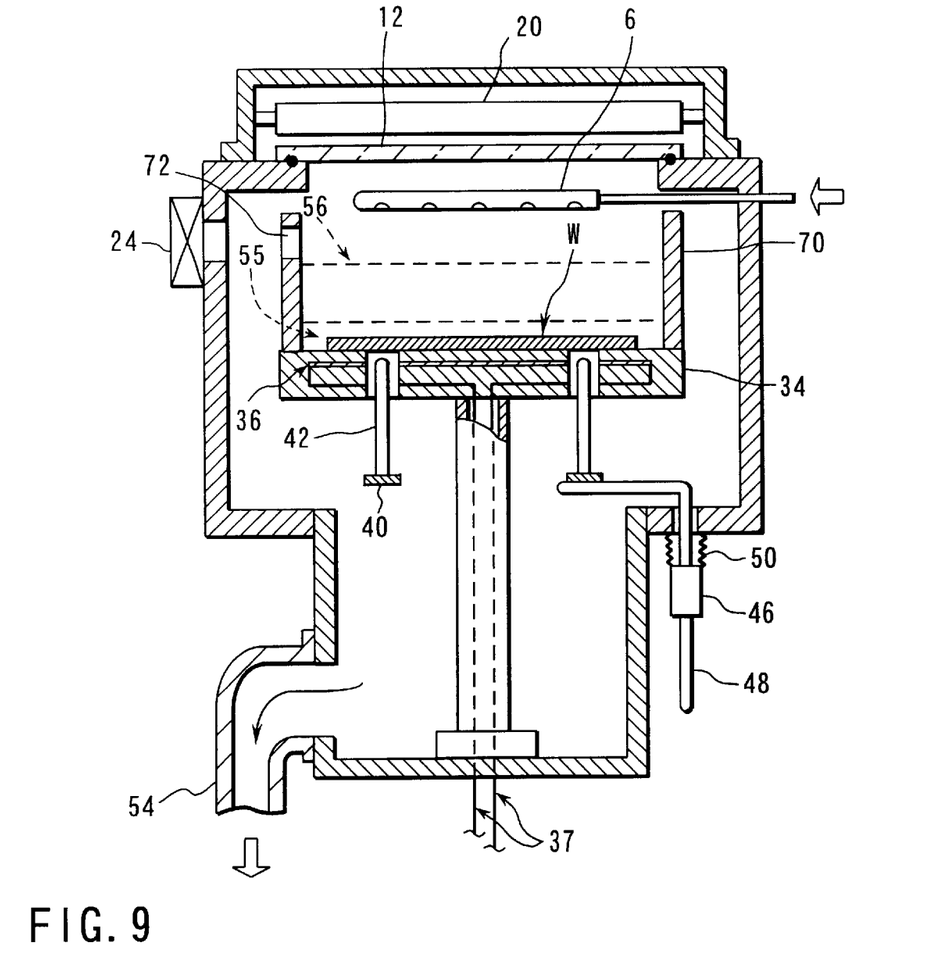
FIG. 9 is a sectional view showing a single-substrate-heat-processing apparatus according to still another embodiment of the present invention, in which the entire region above the worktable is surrounded by a heat ray reflector.
Figure 10:
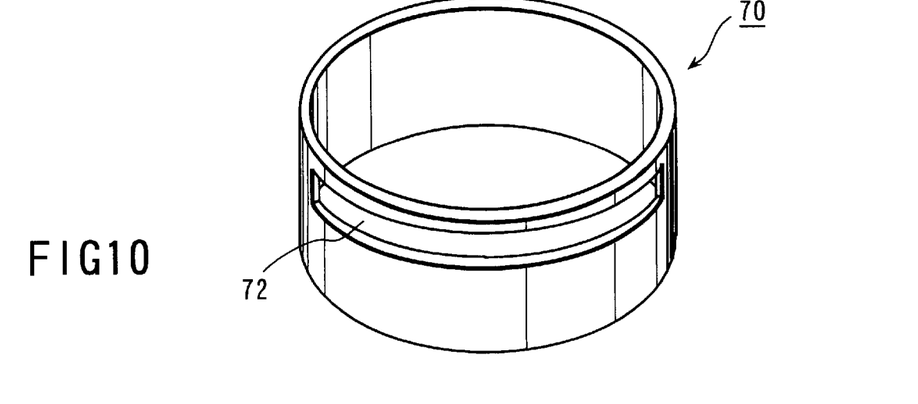
FIG. 10 is a perspective view showing the heat ray reflector of the apparatus shown in FIG. 9.

FIG. 9 is a sectional view showing a single-substrate-heat-processing apparatus according to still another embodiment of the present invention, in which the entire region above the worktable is surrounded by a heat ray reflector, and FIG. 10 is a perspective view showing this heat ray reflector. In this embodiment, a heat ray reflector 70 has a height L2 much larger than that of the heat ray reflector shown in FIG. 1, and is supported by a worktable 34 as it is directly placed on the periphery of the worktable 34. Hence, a lower-temperature heating zone 56 similar to that described above is formed in the heat ray reflector 70. That portion of the heat ray reflector 70 which opposes a port 22 of a process chamber sidewall 4A has a substantially semicircular slit 72 which allows loading/unloading of a wafer W. According to this embodiment, since the heat retaining properties of the lower-temperature heating zone 56 are improved, the temperature increase rate of the wafer W during reformation can be increased accordingly, so that the temperature compensating operation can be improved, thereby further improving the planar uniformity of the wafer temperature.

Figure 11:
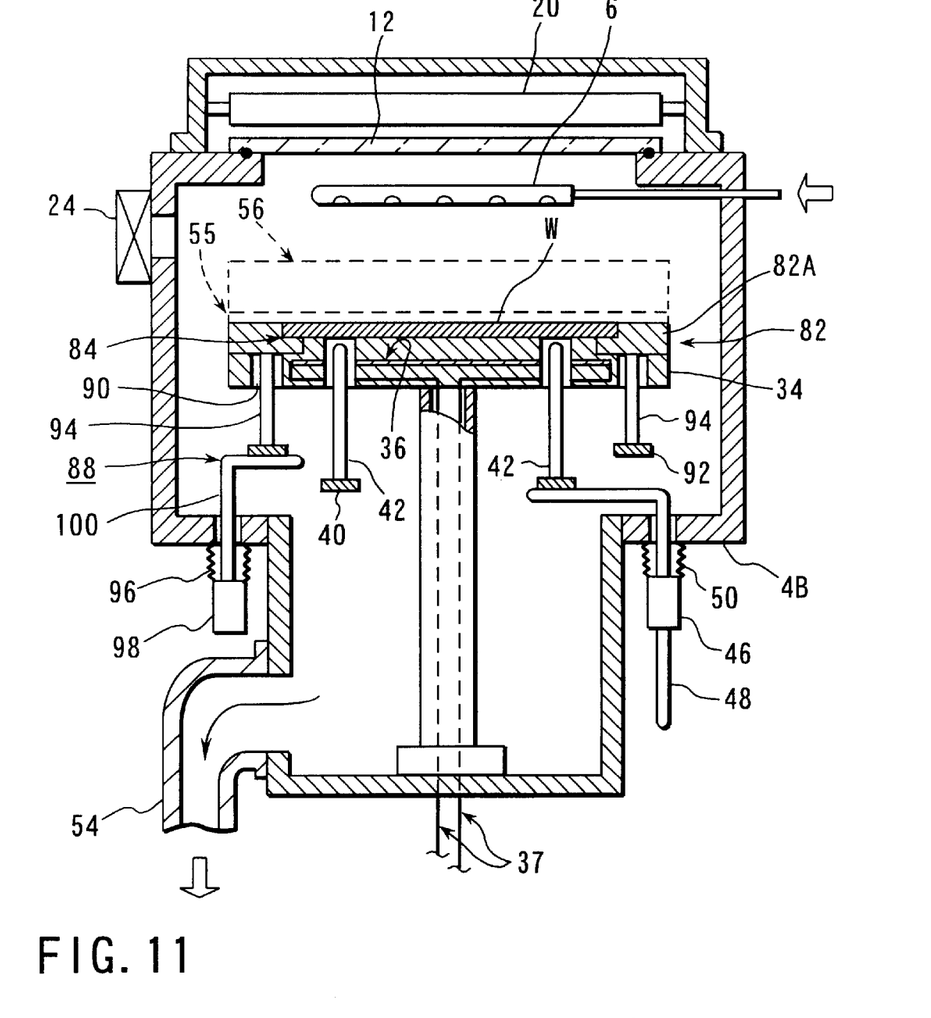
FIG. 11 is a sectional view showing a single-substrate-heat-processing apparatus with a vertically movable ring-like support frame according to still another embodiment of the present invention.
Figure 12:
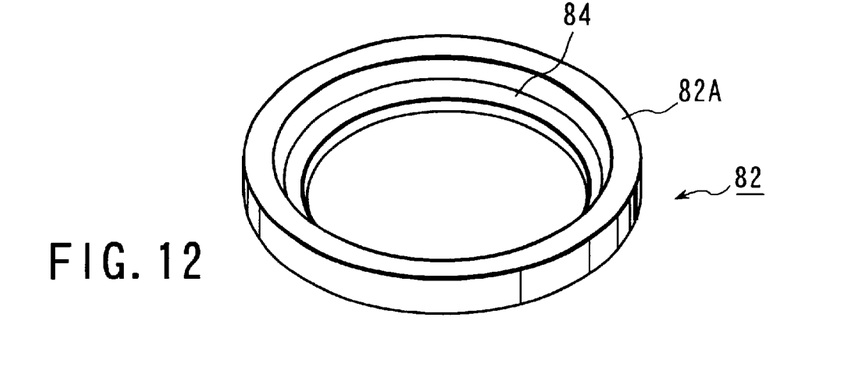
FIG. 12 is a perspective view showing the support frame of the apparatus shown in FIG. 11.

In the above embodiments, the heat ray reflector 58 or 70 and the auxiliary heater 68 are stationarily disposed to surround the lower-temperature heating zone 56. Alternatively, a member with a function similar to those of the heat reflector and auxiliary heater may be disposed such that it can move together with the wafer W. FIG. 11 is a sectional view showing a single-substrate-heat-processing apparatus with a vertically movable ring-like support frame according to still another embodiment of the present invention, and FIG. 12 is a perspective view showing this support frame.

Figure 13:
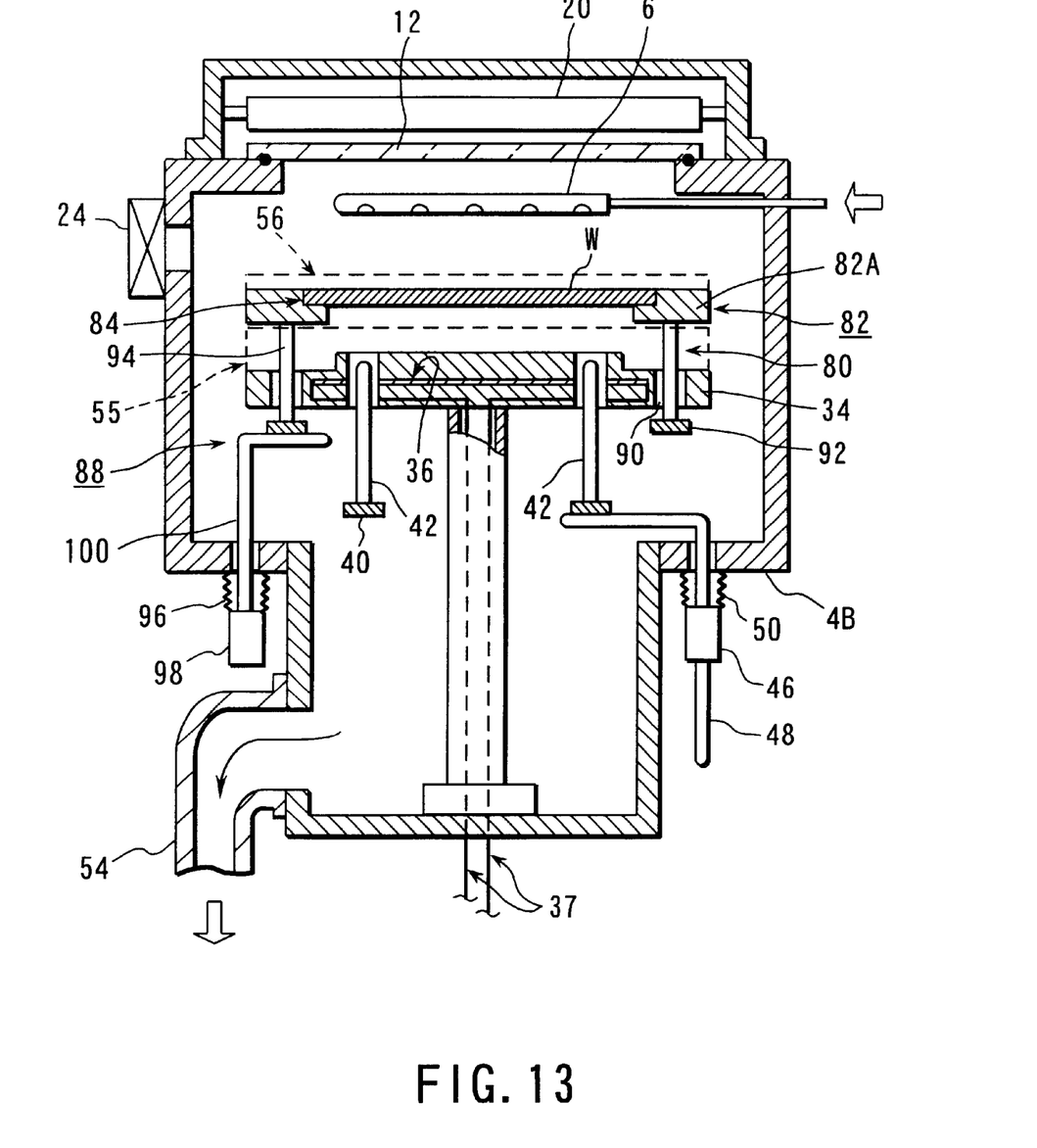
FIG. 13 is a view showing the operation of the apparatus shown in FIG. 11 during a lower-temperature process;.

In this embodiment, a step 80 is formed on the periphery of a worktable 34 to be lower than the surface where a wafer W is to be placed, particularly as shown in FIG. 13. A circular ring-like support frame 82 is set on the step 80 to be vertically movable such that its upper surface becomes substantially horizontally flush with the upper surface of the wafer W. The support frame 82 is made of a heat-resistant, corrosion-resistant ceramic material such as SiC or AlN. A flange 84 (see FIG. 12) is formed on the inner circumferential portion of the support frame 82 so as to come into contact with the peripheral portion of the lower end of the wafer W, thereby substantially supporting the wafer W.

A moving mechanism 88 is disposed around the worktable 34 in order to move the wafer W together with the support frame 82 between a higher-temperature heating zone 55 and lower-temperature heating zone 56. In order to assist loading/unloading of the wafer W, the moving mechanism 88 is driven by an arrangement similar to an assist mechanism (including lifter pins 42).

More specifically, for example, three holes 90 are formed in the peripheral portion of the worktable 34 which is outside the wafer W. The holes 90 respectively loosely receive lifter pins 94 made of, e.g., quartz, and commonly connected to a connection ring 92 at their lower ends. The connection ring 92 for supporting the lifter pins 94 is vertically driven by a lever. The lever is connected to a piston rod 100 of an air cylinder 98 provided to the lower surface of a bottom portion 4B. A bellows 96 is interposed between the air cylinder 98 and the lower surface of the bottom portion 4B. The piston rod 100 is vertically moved while the airtightness in a process chamber 4 is maintained by the bellows 96.

The peripheral portion of the support frame 82 forms a heat accumulating portion 82A with a certain thickness to accumulate heat, and functions as a heat compensation member. When the heat accumulating portion 82A is placed on the worktable 34, it is heated by the worktable 34 and thus accumulates heat. When the wafer W is to be processed in the lower-temperature heating zone 56, the heat accumulating portion 82A compensates for the heat on the peripheral portion of the wafer w by utilizing the accumulated heat. For this purpose, when the wafer W is supported by the support frame 82, the distance between the wafer W and heat accumulating portion 82A is set to about 0 to 20 mm, preferably to 0 mm.

More specifically, before the wafer W is loaded in the process chamber 4, the support frame 82 is moved downward onto the worktable 34 and is heated to a reformation temperature of, e.g., about 670° C. When the support frame 82 is heated to almost the reformation temperature, the wafer W is loaded into the process chamber 4. That is, in the upper transfer space, the wafer W is transferred from the external transfer arm (not shown) to the inner lifter pins 42. Simultaneously, the moving mechanism 88 is driven to move the outer lifter pins 94 upward to arrange the heated support frame 82 in the lower-temperature heating zone 56. Subsequently, the lifter pins 42 that have received the wafer W are moved downward to transfer the wafer W onto the support frame 82, as shown in FIG. 13.

Then, reformation is performed in the state shown in FIG. 13. In this case, a large heat quantity is supplied from the heat accumulating portion 82A of the support frame 82 to the peripheral portion of the wafer W where the heat dissipation quantity tends to increase. This compensates for the temperature of the peripheral portion of the wafer, so the planar uniformity of the wafer temperature can be improved during reformation. During this reformation, the worktable 34 can be heated to a crystallization temperature of, e.g., about 800° C., or a temperature near it. When reformation is ended, the lifter pins 94 are moved downward to bring the support frame 82 and wafer W into contact with the upper surface of the worktable 34, as shown in FIG. 11. Crystallization is continuously performed in this state.

In this manner, in this embodiment as well, two heat processes with different process temperatures can be performed continuously and quickly. Alternatively, the wafer W may be temporarily placed on the worktable 34 so it is heated to the reformation temperature or a temperature near it, and may be then moved upward to the lower-temperature heating zone 56.

Figure 14:
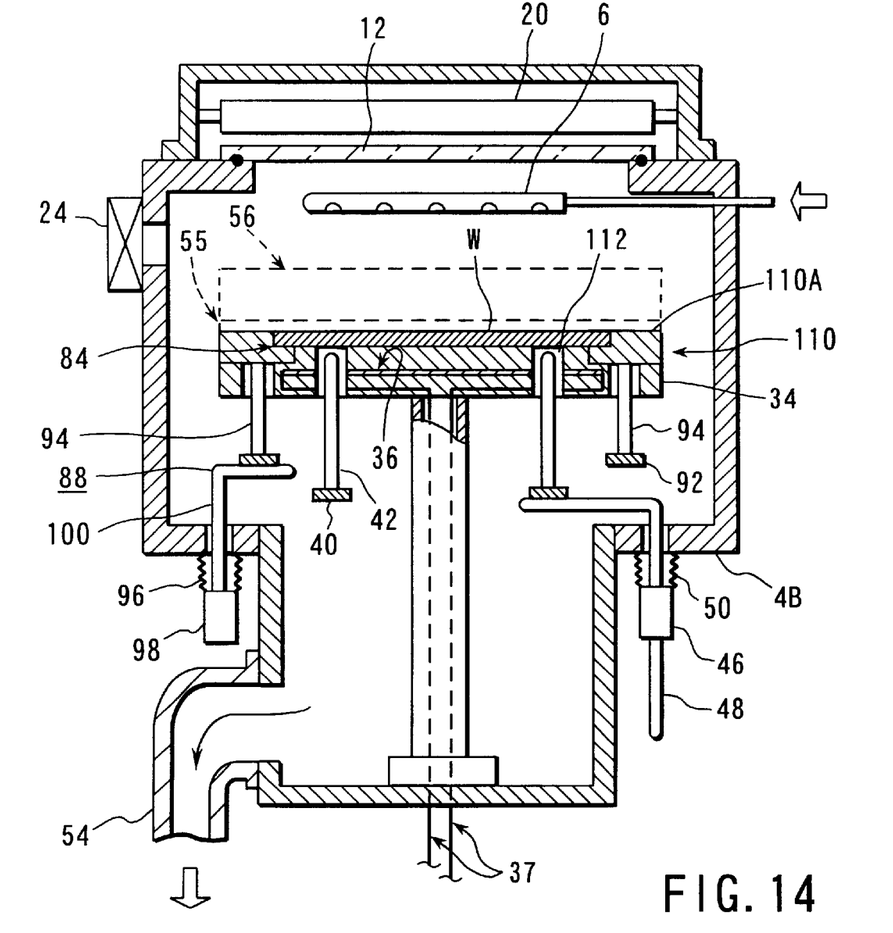
FIG. 14 is a sectional view showing a single-substrate-heat-processing apparatus with a vertically movable disk-like support plate according to still another embodiment of the present invention.
Figure 15:
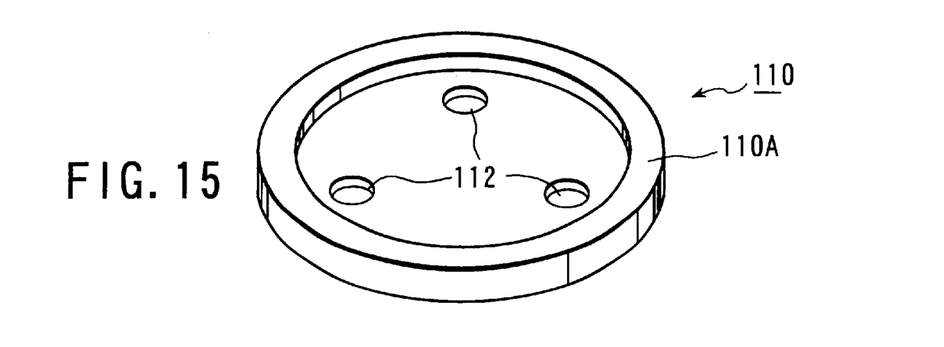
FIG. 15 is a perspective view showing the support plate of the apparatus shown in FIG. 14.
Figure 16:
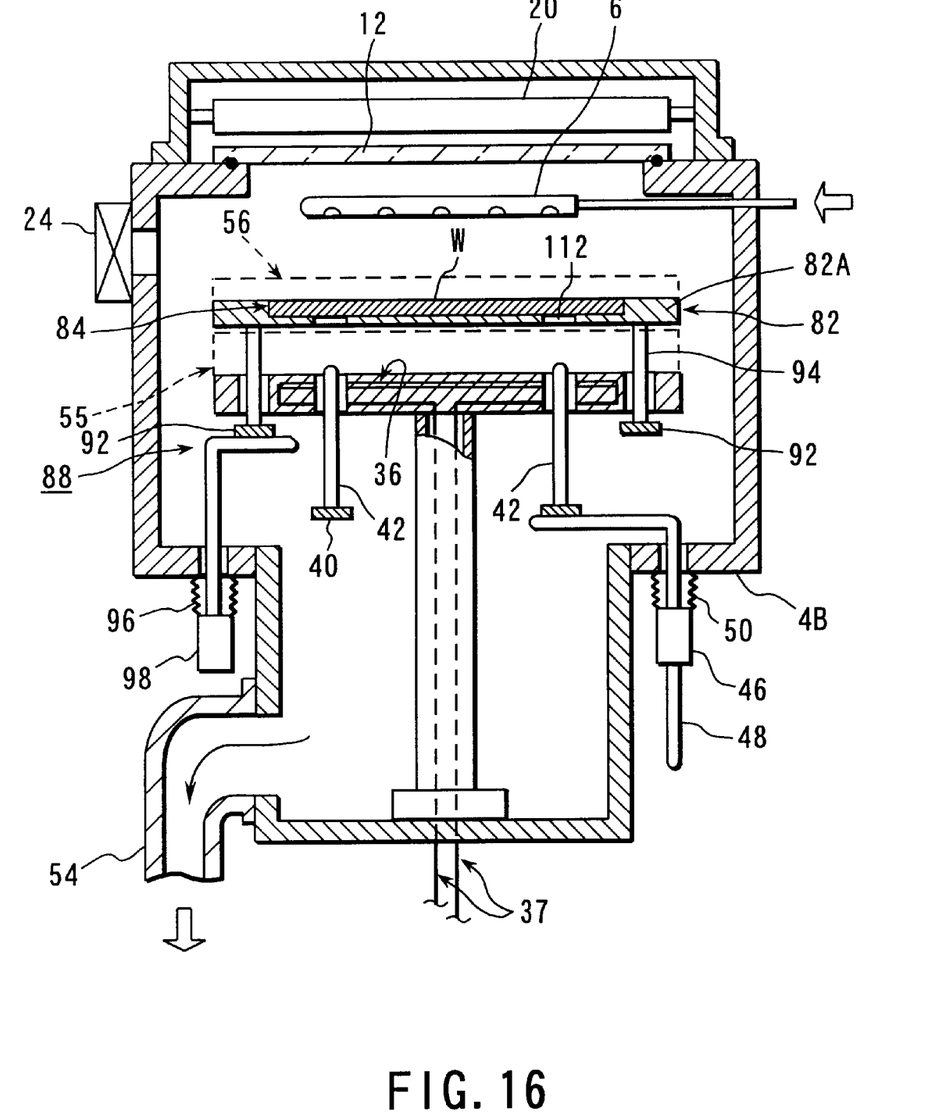
FIG. 16 is a view showing the operation of the apparatus shown in FIG. 14 during a lower-temperature process.

FIG. 14 is a sectional view showing a single-substrate-heat-processing apparatus with a vertically movable disk-like support plate according to still another embodiment of the present invention, and FIG. 15 is a perspective view showing this support plate.

This embodiment includes a substantially disk-like support plate 110 which is moved together with a wafer W between a higher-temperature heating zone 55 and lower-temperature heating zone 56. The support plate 110 comes into contact with substantially the entire lower surface of the wafer W to support it. The periphery of the support plate 110 forms a thick heat accumulating portion 110A with an upper surface horizontally flush with the upper surface of the wafer W. As shown in FIG. 15, the support plate 110 has holes 112 in which lifter pins 42 for transferring the wafer W are to be inserted.

According to this embodiment, an operation and effect similar to those of the apparatus shown in FIGS. 11 to 13 can be obtained. Furthermore, since the support plate 110 can come into contact with the entire lower surface of the wafer W to heat it, the wafer W can be heated to the reformation temperature more quickly, thereby further increasing the throughput.

The lower- and higher-temperature processes in the above embodiments are merely examples, and the present invention is not limited to them. Concerning the order of the processes, either of the lower- and higher-temperature processes may be performed first. The present invention can also be applied to processes other than reformation and crystallization, e.g., processes such as film formation, etching, oxidation, and diffusion. The present invention can also be applied to a target substrate other than a semiconductor wafer, e.g., an LCD substrate or glass substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A single-substrate-heat-processing apparatus for a semiconductor process, comprising:
   an airtight process chamber;
   a worktable configured to place a target substrate thereon and to heat the target substrate in the process chamber;
   a first heater configured to heat the worktable;
   a gas supply system configured to supply a process gas into the process chamber;
   an exhaust system configured to evacuate an interior of the process chamber;
   a moving mechanism configured to move the target substrate between a first position on the worktable and a second position above the worktable, the first and second positions being set to subject the target substrate to first and second processes, the first process having a process temperature higher than that of the second process; and
   a heat compensation member configured to surround the target substrate so as to compensate for heat dissipated from a peripheral portion of the target substrate when the target substrate is located at the second position, the heat compensation member being disposed in the process chamber and separated from an inner surface of the process chamber through a gap.

2. The apparatus according to claim 1, wherein the heat compensation member is arranged to be separate from the peripheral portion of the target substrate by a distance of 1 to 20 mm.

3. The apparatus according to claim 2, wherein the heat compensation member has a reflector with an opposing surface opposing the periphery of the target substrate, and reflects heat rays and radiation heat with the opposing surface, thereby compensating for heat radiated from the peripheral portion of the target substrate.

4. The apparatus according to claim 3, wherein the opposing surface forms a mirror surface with a surface roughness Rmax of not more than 25 $\mu$m.

5. The apparatus according to claim 3, wherein the heat compensation member is made of a ceramic material.

6. The apparatus according to claim 2, wherein the heat compensation member has a second heater configured to heat the peripheral portion of the target substrate.

7. The apparatus according to claim 1, further comprising an assist mechanism configured to move the target substrate between the first position and a third position above the second position in order to assist loading/unloading of the target substrate on/from the worktable with an external transfer arm.

8. The apparatus according to claim 7, wherein the assist mechanism and the moving mechanism are a single mechanism.

9. The apparatus according to claim 8, wherein the single mechanism has a plurality of lifter pins projectable toward or retractable from the worktable.

10. The apparatus according to claim 1, wherein the heat compensation member is moved together with the target substrate by the moving mechanism when the target substrate is to be moved between the first and second position by the moving mechanism.

11. The apparatus according to claim 10, wherein the heat compensation member is arranged to be separate from the peripheral portion of the target substrate by a distance of 0 to 20 mm.

12. The apparatus according to claim 10, wherein the heat compensation member has a heat accumulation member configured to accumulate heat when coming into contact with the worktable and heated thereby, and to perform heat compensation for the target substrate by using accumulated heat.

13. The apparatus according to claim 10, wherein the moving mechanism has a support plate configured to come into contact with an substantially entire lower surface of the target substrate.

14. The apparatus according to claim 1, wherein the first heater has a resistance heater buried in the worktable.

15. A single-substrate-heat-processing apparatus for a semiconductor process, comprising:
   an airtight process chamber;
   a worktable configured to place a target substrate thereon in the process chamber;
   a first heater configured to heat the worktable;
   a gas supply system configured to supply a process gas into the process chamber;
   an exhaust system configured to evacuate an interior of the process chamber;
   a first heating zone set in the process chamber in order to subject the target substrate to a first process at a first process temperature, the target substrate being heated, while being placed on the worktable, in the first heating zone by the first heater as a heat source;
   a second heating zone set in the process chamber in order to subject the target substrate to a second process at a second process temperature, the target substrate being heated, while being placed above the worktable, in the second heating zone by the first heater as a heat source, the second process temperature being lower than the first process temperature;

a heat compensation member configured to surround the target substrate to compensate for heat dissipated from a peripheral portion of the target substrate in the second heating zone, the heat compensation member being disposed in the process chamber and separated from an inner surface of the process chamber through a gap; and a moving mechanism configured to move the target substrate between the first and second heating zones.

16. The apparatus according to claim 15, wherein the second heating zone is arranged between the first heating zone and a transfer space where the target substrate is loaded therein/unloaded therefrom relative to a space outside the process chamber.

* * * * *